US006812060B1

(12) United States Patent
Kurita et al.

(10) Patent No.: US 6,812,060 B1
(45) Date of Patent: Nov. 2, 2004

(54) MULTILAYER FLEXIBLE WIRING BOARDS AND PROCESSES FOR MANUFACTURING MULTILAYER FLEXIBLE WIRING BOARDS

(75) Inventors: Hideyuki Kurita, Chuou-ku (JP); Hiroyuki Hishinuma, Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 179 days.

(21) Appl. No.: 09/688,181

(22) Filed: Oct. 16, 2000

(30) Foreign Application Priority Data

Oct. 18, 1999 (JP) .......................................... 11-294686

(51) Int. Cl.[7] .......................... H01L 21/44; H01L 21/48; H01L 21/50
(52) U.S. Cl. .......................... 438/106; 438/25; 438/26; 438/51; 438/55; 438/64; 257/123; 257/678; 257/686; 257/688; 439/55; 439/68; 439/69; 439/70; 439/72; 439/943
(58) Field of Search .......................... 438/25–26, 51–55, 438/56, 64, 106; 257/678, 686–688, 700, 123; 439/55, 68–70, 72, 943

(56) References Cited

U.S. PATENT DOCUMENTS

| 4,589,584 A | | 5/1986 | Christiansen et al. |
| 4,627,565 A | | 12/1986 | Lomerson |
| 4,796,132 A | | 1/1989 | Dekura et al. |
| 4,893,742 A | * | 1/1990 | Bullock ...................... 228/110 |
| 5,054,192 A | * | 10/1991 | Cray et al. ..................... 29/835 |
| 5,298,715 A | * | 3/1994 | Chalco et al. ......... 219/121.64 |
| 5,317,801 A | * | 6/1994 | Tanaka et al. ................. 29/830 |
| 5,354,392 A | | 10/1994 | Santo et al. |
| 5,390,013 A | * | 2/1995 | Snelling ...................... 355/285 |
| 5,477,315 A | * | 12/1995 | Mashtare ..................... 355/273 |
| 5,511,719 A | * | 4/1996 | Miyake et al. .............. 228/106 |
| 5,655,700 A | * | 8/1997 | Pham et al. ................. 228/106 |
| 6,019,271 A | * | 2/2000 | Hayden et al. ........... 228/110.1 |
| 6,107,123 A | * | 8/2000 | Distefano et al. ............ 438/125 |
| 6,193,136 B1 | * | 2/2001 | Higashi et al. .............. 228/106 |
| 6,232,152 B1 | * | 5/2001 | DiStefano et al. ........... 438/124 |
| 2001/0018982 A1 | * | 9/2001 | Gotoh et al. ................. 174/250 |

FOREIGN PATENT DOCUMENTS

| EP | 0494668 A2 | * | 9/1992 | ............ H05K/3/46 |
| EP | 0543364 A2 | * | 11/1992 | ............ H05K/3/46 |
| GB | A 2 157 085 | | 10/1985 | |
| JP | A 1-202898 | | 8/1989 | |
| JP | A-1-220494 | | 9/1989 | |
| JP | 4-10696 | * | 1/1992 | ............ H05K/3/46 |
| JP | A 5-327212 | | 12/1993 | |
| JP | 05-327212 | * | 12/1993 | ............ H05K/3/46 |
| JP | 6-69652 | * | 3/1994 | ............ H05K/3/46 |
| JP | 06-164079 | * | 6/1994 | ............ H05K/1/02 |
| JP | A-7-302974 | | 11/1995 | |
| JP | 07-302974 | * | 11/1995 | ............ H05K/3/36 |
| JP | A 8-510868 | | 11/1996 | |
| WO | WO 94/29897 | | 12/1994 | |

* cited by examiner

Primary Examiner—Matthew Smith
Assistant Examiner—Granvill D. Lee, Jr.
(74) Attorney, Agent, or Firm—Oliff & Berridge, PLC

(57) ABSTRACT

The present invention provides bumpless ultrasonic bonding of flexible wiring board pieces.

A metal coating 26 is formed on the surface of a contact region $18_1$ of a metal wiring 28 of each of two flexible wiring board pieces 10, 30 and ultrasonic wave is individually applied by an ultrasonic resonator 45 to the contact regions $18_1$ in contact with each other. The metal coatings 26 are bonded to form a multilayer flexible wiring board 50. The bumpless process eliminates any plating step for forming bumps without being influenced by non-uniformity bump height. A thermoplastic resin film 33 may be formed on the surface of one flexible wiring board piece 30 to bond flexible wiring board pieces 10, 30 by the adhesion of the resin film 33.

14 Claims, 9 Drawing Sheets

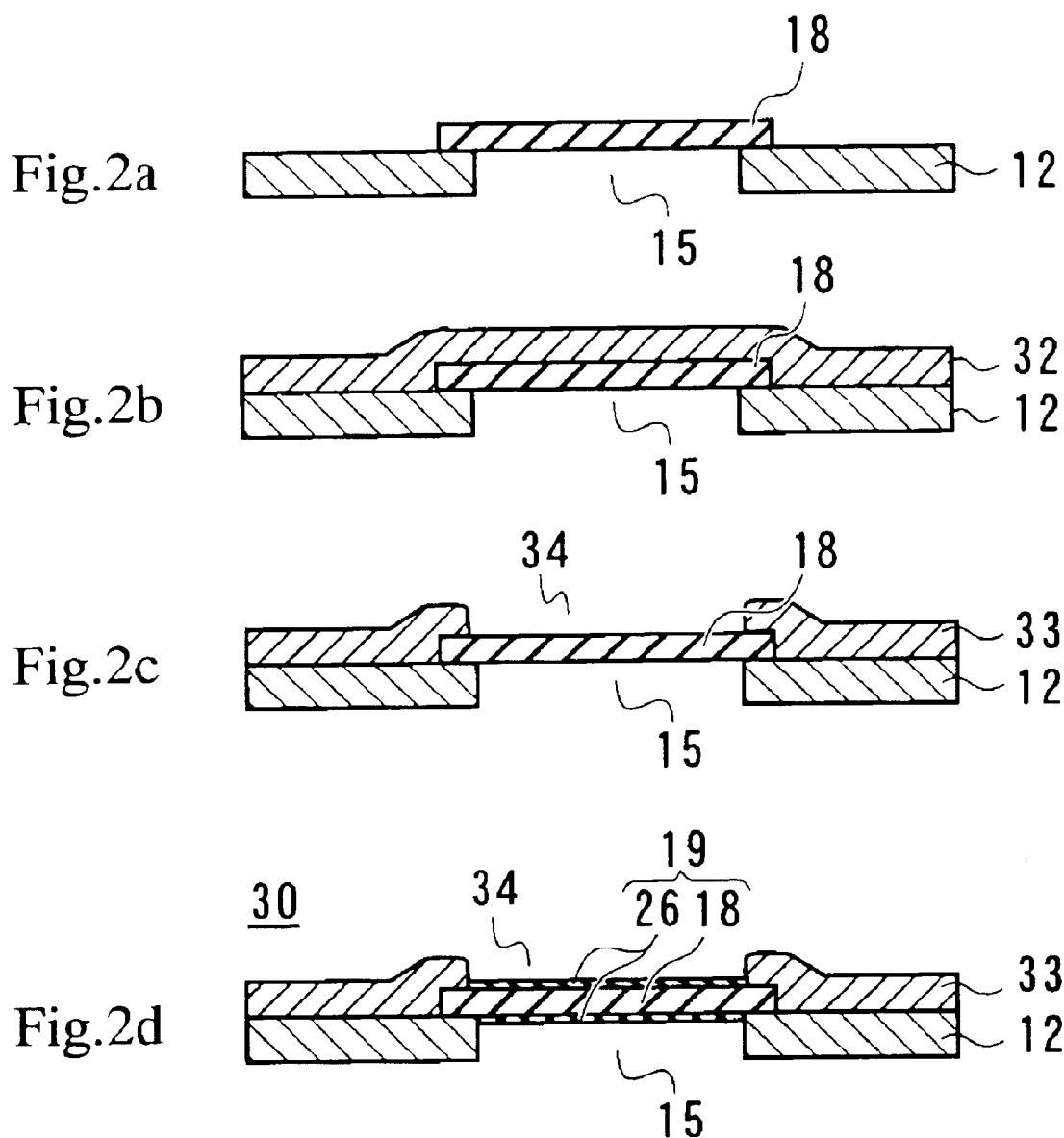

US 6,812,060 B1

MULTILAYER FLEXIBLE WIRING BOARDS AND PROCESSES FOR MANUFACTURING MULTILAYER FLEXIBLE WIRING BOARDS

BACKGROUND OF THE INVENTION

The present invention relates to the field of flexible wiring boards, particularly to the technique of laminating flexible wiring board pieces into a flexible wiring board of multilayer structure.

Recently, multilayer flexible wiring boards are widely used in the field of electronic apparatus. A method for forming a multilayer flexible wiring board involves laminating a plurality of flexible wiring board pieces.

An example of process for laminating two flexible wiring board pieces is explained with reference to the attached drawings as follows. Referring to FIG. 8, the reference 110 represents a flexible wiring board piece used for lamination. This flexible wiring board piece 110 has a base film 117 on which a metal wiring 115 is formed by patterning a copper foil. A resin film 112 is provided on metal wiring 115.

This resin film 112 is thermoplastic, i.e. it is not adhesive at normal temperatures but softens to develop adhesiveness upon heating.

Resin film 112 has a plurality of openings 120 in which a plurality of bumps 121 are provided.

The bottom of each bump 121 is connected to metal wiring 115 while the top projects from the surface of resin film 112.

The reference 130 in FIG. 9 represents a flexible wiring board piece to be laminated to said flexible wiring board piece 110. This flexible wiring board piece 130 has a base film 132 on which a metal wiring 135 is formed by patterning a copper foil, similarly to said flexible wiring board piece 110.

A non-thermoplastic cover film 138 is provided on metal wiring 135 and said cover film 138 has openings 139 at the locations corresponding to bumps 121 of said flexible wiring board piece 110 so that the surface of metal wiring 135 is exposed at the bottom of each opening.

For laminating these two flexible wiring board pieces 110, 130, one flexible wiring board piece 130 is mounted on a table 142 with openings 139 upward and opposed to the other flexible wiring board piece 110 with bumps 121 downward (FIG. 10(a)).

Then, the top of bump 121 is contacted with the surface of metal wiring 135 at the bottom of opening 139, and an ultrasonic resonator 145 is pressed against base film 117 of one flexible wiring board piece 110 (FIG. 10(b)).

Ultrasonic resonator 145 is connected to an ultrasonic wave generator not shown, which is activated to transmit ultrasonic wave to ultrasonic resonator 145 pressed against flexible wiring board pieces 110, 130 so that ultrasonic resonator 145 applies ultrasonic wave to flexible wiring board pieces 110, 130. Thus, bumps 121 are connected to metal wiring 135 in contact with said bumps 121 by this ultrasonic vibration.

Then, these flexible wiring board pieces 110, 130 are heated under pressure so that resin film 112 softens to develop adhesiveness, whereby flexible wiring board pieces 110, 130 are connected via resin film 112 into a multilayer flexible wiring board 150 (FIG. 10(c)).

Thus, the use of ultrasonic resonator 145 eliminates the use of solder to electrically connect flexible wiring board pieces 110, 130 by a single ultrasonic application while pressing a plurality of bumps 121 against metal wiring 135.

However, such bumps 121 are formed by a complex copper plating process.

With such an ultrasonic resonator 145 pressed against the whole flexible wiring board pieces 110, 130 to apply ultrasonic wave, connection failure may occur if the heights of bumps 121 are not uniformity. For example, the reference 151 in FIG. 10(c) represents such a connection failure, in which a lower bump 122 is not connected to metal wiring 135 because of lack of contact with metal wiring 135 during ultrasonic application in contrast with a higher bump 121 connected to the surface of metal wiring 115.

Bumps 121 should have a uniformity of height within ±3 μm or less to efficiently connect flexible wiring board pieces 110, 130, but this is difficult when bumps 121 are formed by electroplating as described above.

Moreover, bumps 121 should fill openings 120 and project from the surface of resin film 112 by growing copper to a thickness of 40 μm or more, but it takes one hour or more to attain such a thickness by electroplating, resulting in increase of production costs.

An object of the present invention is to obtain a multilayer flexible wiring board from flexible boards at low cost with high yield to overcome the disadvantages of the prior art described above.

SUMMARY OF THE INVENTION

In order to attain the above object, the present invention provides a process for manufacturing a multilayer flexible wiring board by laminating flexible wiring board pieces having a base film including a resin film and a metal wiring provided on said base film, said process comprising applying ultrasonic wave to said metal wirings of said flexible wiring board pieces to be laminated in close contact with each other at their surfaces to bond said metal wirings.

The present invention also provides a process for manufacturing a multilayer flexible wiring board by bonding metal wirings of at least two flexible wiring board pieces having a base film including a resin film and a metal wiring provided on said base film, said process comprising contacting the tip of ultrasonic resonator with the exposed opposite side of a portion to be bonded of said metal wirings of at least one flexible wiring board piece in two flexible wiring board pieces to be bonded, and applying iltrasonic wave to said ultrasonic resonator to bond said two metal wirings to be bonded.

In the process for manufacturing a multilayer flexible wiring board of the present invention, ultrasonic wave is applied to said metal wirings in close contact with each other at their surfaces while a thermoplastic resin layer developing adhesiveness upon heating is placed between said metal wirings.

In the process for manufacturing a multilayer flexible wiring board of the present invention, said metal wirings are ultrasonically bonded and then heated to laminate said flexible wiring board pieces by the adhesion of said thermoplastic resin.

In the process for manufacturing a multilayer flexible wiring board of the present invention, a metal coating selected from a metal coating based on gold, a metal coating based on silver, a metal coating based on nickel, a copper-nickel alloy coating, a coating based on aluminium, a coating based on titanium and a solder coating is preliminarily formed on at least one of the surfaces of the parts of said metal wirings to be ultrasonically bonded before said metal wirings are ultrasonically bonded.

In the process for manufacturing a multilayer flexible wiring board of the present invention, ultrasonic wave is individually applied to the parts of said metal wirings to be bonded.

The present invention also provides a multilayer flexible wiring board formed by laminating at least two flexible wiring board pieces having a base film and a metal wiring provided on said base film, wherein at least one flexible wiring board piece has a cover film including a resin film on said metal wiring and a first opening is provided on said cover film, and said metal wiring exists at the bottom of said first opening so that said metal wirings of said flexible wiring board pieces are bonded to each other by applying ultrasonic wave while the part of said metal wiring located at the bottom of said first opening is in close contact with said metal wiring of the other flexible wiring board piece.

In the multilayer flexible wiring board of the present invention, said cover film has insulating properties to prevent said connected metal wirings from contacting with each other except for the part located at said first opening.

In the multilayer flexible wiring board of the present invention, said cover film has a thermoplastic resin layer developing adhesiveness upon heating at least on its surface.

In the multilayer flexible wiring board of the present invention, said first opening and said metal wiring located at the bottom of said first opening forms a concave and the part of said metal wiring of the other flexible wiring board piece to be bonded to said concave is convex on said base film.

In the multilayer flexible wiring board of the present invention, said convex part of said metal wiring of the other flexible wiring board piece has an area smaller than that of said first opening forming said concave.

The present invention also provides a multilayer flexible wiring board formed by laminating at least two flexible wiring board pieces having a base film and a metal wiring provided on said base film, wherein said base film of at least one flexible wiring board piece has a second opening in which said metal wiring exists at the bottom so that said metal wirings are bonded to each other by applying ultrasonic wave while said metal wiring of the other flexible wiring board piece is in close contact with said metal wiring located at the bottom of said second opening.

In the multilayer flexible wiring board of the present invention, said base film has insulating properties to prevent said metal wirings from contacting with each other except for the part located at said second opening.

In the multilayer flexible wiring board of the present invention, at least one of the surfaces of the parts of said metal wirings to be ultrasonically connected has a metal coating selected from a metal coating based on gold, a metal coating based on silver, a metal coating based on nickel, a copper-nickel alloy coating, a coating based on aluminium, a coating based on titanium and a solder coating.

In the multilayer flexible wiring board of the present invention, said metal wirings to be connected to each other have the same type metal coating on their surfaces.

According to the present invention as defined above, ultrasonic wave is applied to metal wirings in contact with each other at their surfaces to eliminate formation of bumps via electroplating, thus reducing failures due to non-uniformity of bump height.

A resin film is provided on at least one flexible wiring board pieces to be laminated, and the contact region of the metal wiring is exposed at the bottom of an opening formed in the resin film, whereby the resin film at the opening serves to guide the metal wiring of the other flexible wiring board piece into the opening. In this case, the metal wiring of the other flexible wiring board piece may be convex to fit in a concave formed by the opening to facilitate aligning.

Ultrasonic wave is applied under pressure with an ultrasonic resonator directly pressed against the opposite side of one of metal wirings (portion to be bonded of metal wirings) in contact with each other, whereby ultrasonic wave is individually applied to the contact regions to ensure electric connection between the contact regions.

Said resin film may be formed of a thermoplastic resin to mechanically connect flexible wiring board pieces by the adhesion of the resin film.

In case of ultrasonic bonding, the condition of bonding of metal coating is depend on the combination of metal materials forming the parts of to be bonded. Table 1 below shows the results of our investigations on the ultrasonic bonding strength of combinations of various metals.

TABLE 1

Relationship between combination of metals and bonding properties

| Al | Be | Cu | Ge | Au | Fe | Mg | Mo | Ni | Nb | Pd | Pt | Re | Si | Ag | Ta | Sn | Ti | W | U | Zr | Pb | |
|---|---|---|---|---|---|---|---|---|---|---|---|---|---|---|---|---|---|---|---|---|---|---|
| 2 | 2 | 2 | 2 | 2 | 0 | 2 | 2 | 2 | | 2 | 1 | | 1 | 2 | 2 | 0 | 2 | | 0 | 1 | | Al |
| | 1 | 1 | | | 0 | | | | | | | | | | | | | | | | | Be |
| | | 2 | | 2 | 0 | 1 | 1 | 2 | | | 1 | 1 | | 2 | 1 | | 2 | | | 1 | | Cu |
| | | | | 1 | | | | | | | 1 | | | | | | | | | | | Ge |
| | | | | 2 | 0 | | | 2 | | | 1 | | 1 | 2 | | | 2 | 0 | | 1 | | Au |
| | | | | | 0 | | 0 | 0 | | | 0 | 0 | | 0 | 0 | | 0 | 0 | 0 | 0 | | Fe |
| | | | | | | 1 | | | | | | | | 1 | | | 1 | | | | | Mg |
| | | | | | | | 1 | 2 | | | | | | 1 | | | 1 | 0 | | 1 | | Mo |
| | | | | | | | | 2 | 1 | | 1 | 1 | | 2 | 1 | | 2 | 2 | | | | Ni |
| | | | | | | | | | 1 | | | | | | 1 | | | | | | | Nb |
| | | | | | | | | | | 2 | | | | 2 | | | | | | | | Pd |
| | | | | | | | | | | | | 1 | | 1 | | | | | | | | Pt |
| | | | | | | | | | | | | | 1 | | 1 | | | | | | | Re |
| | | | | | | | | | | | | | | | 1 | | | | | | | Si |
| | | | | | | | | | | | | | | | 2 | 1 | | | | 1 | | Ag |
| | | | | | | | | | | | | | | | | 1 | | | 0 | | | Ta |
| | | | | | | | | | | | | | | | | | | 0 | 0 | | | Sn |

TABLE 1-continued

Relationship between combination of metals and bonding properties

| Al | Be | Cu | Ge | Au | Fe | Mg | Mo | Ni | Nb | Pd | Pt | Re | Si | Ag | Ta | Sn | Ti | W | U | Zr | Pb | |
|---|---|---|---|---|---|---|---|---|---|---|---|---|---|---|---|---|---|---|---|---|---|---|
| | | | | | | | | | | | | | | | | | 2 | 2 | | | | Ti |
| | | | | | | | | | | | | | | | | | | 0 | | | | W |
| | | | | | | | | | | | | | | | | | | | 1 | 1 | | U |
| | | | | | | | | | | | | | | | | | | | | 1 | | Zr |
| | | | | | | | | | | | | | | | | | | | | | 0 | Pb |

0: No bond
1: Weak bond
2: Strong bond

In Table 1, "2" means strong bond, "1" means weak bond and "0" means no bond.

In case of the present invention, the bond strength may differ from the results of Table 1, because the parts to be bonded are the surfaces of metal wirings. For example, copper-copper combination shows strong bond in case of wire bonding but resulted in weak bond in the metal coating formed on the surface of metal wirings of flexible wiring board pieces as in the present invention.

Accordingly, suitable metal coatings formed on the surface of the metal wiring of the present invention include a metal coating based on gold, a metal coating based on silver, a metal coating based on nickel, a copper-nickel alloy coating, a coating based on aluminium, a coating based on titanium and a solder coating. Two of these metal coatings may be chosen and formed on the surfaces of metal wirings to be ultrasonically bonded.

The flexible wiring board piece and the multilayer flexible wiring board of the present invention have property of flexibility.

BRIEF DESCRIPTION OF THE DRAWINGS

The present invention will now be explained with reference to the attached drawings, in which:

FIGS. 2(a)–(d) shows a process for manufacturing another flexible wiring board piece for use in a multilayer flexible wiring board of the present invention;

DETAILED DESCRIPTION OF THE INVENTION

Figure 1A:
FIGS. 1(a)–(g) shows a process for manufacturing a flexible wiring board piece for use in a multilayer flexible wiring board of the present invention.
Figure 1B:
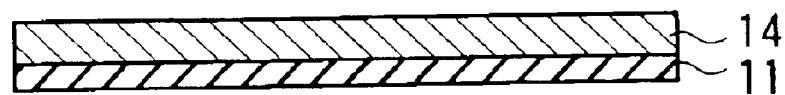

Referring to FIG. 1(a), the reference 11 represents a metal foil consisting of a rolled copper foil having a thickness of 12 μm. A polyimide precursor solution (the polyimide precursor solution here is a polyimide adhesive G101 made by Sony Chemicals Corp.) is initially coated on the top of this metal foil 11 and dried to form a polyimide precursor layer 14 (FIG. 1(b)).

Figure 1C:
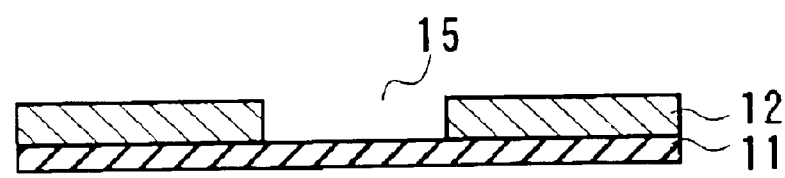

Then, polyimide precursor layer 14 is patterned by photolithography and etching and then cured by heat treatment to form a patterned base film 12 (FIG. 1(c)). This base film 12 has a thickness of about 20 μm.

The reference 15 in FIG. 1(c) represents an opening in base film 12 and a plurality of such openings 15 are provided at predetermined locations (only one is shown). Metal foil 11 is exposed at the bottom of each opening 15.

Figure 1D:
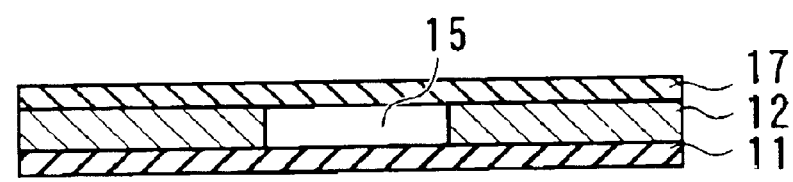

Then, a protective film 17 is applied on the top of base film 12 to temporarily close opening 15 (FIG. 1(d)).

Figure 1E:
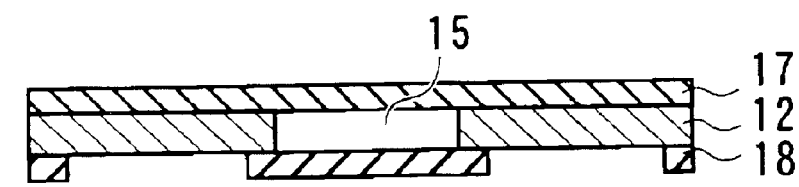

When photolithography and etching are performed as such, any etching solution does not enter opening 15 and metal foil 11 is patterned to form a metal wiring body 18 (FIG. 1(e)). The reference 16 represents a gap separating metal wiring bodies 18.

Figure 1F:
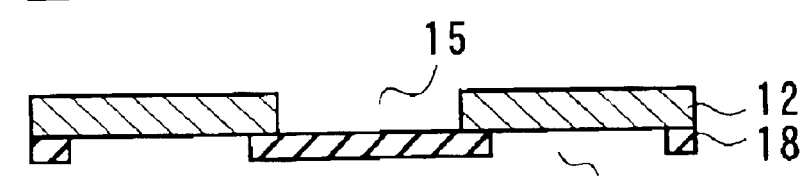

Then, protective film 17 is removed (FIG. 1(f)) and the assembly is electroplated in a plating solution to form a metal coating 26 on the surface of metal wiring body 18 exposed at the bottom of opening 15 and on the surface of metal wiring body 18 exposed on base film 12, whereby a metal wiring 19 comprising metal wiring body 18 and metal coating 26 is obtained. Metal coating 26 here is a gold coating.

Figure 1G:
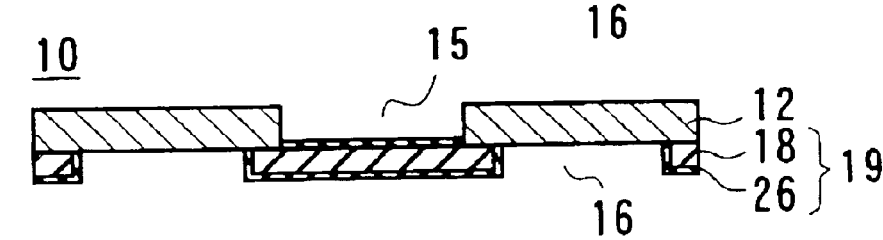

The reference 10 in FIG. 1(g) represents a flexible wiring board piece having metal coating 26.

Figure 3A:
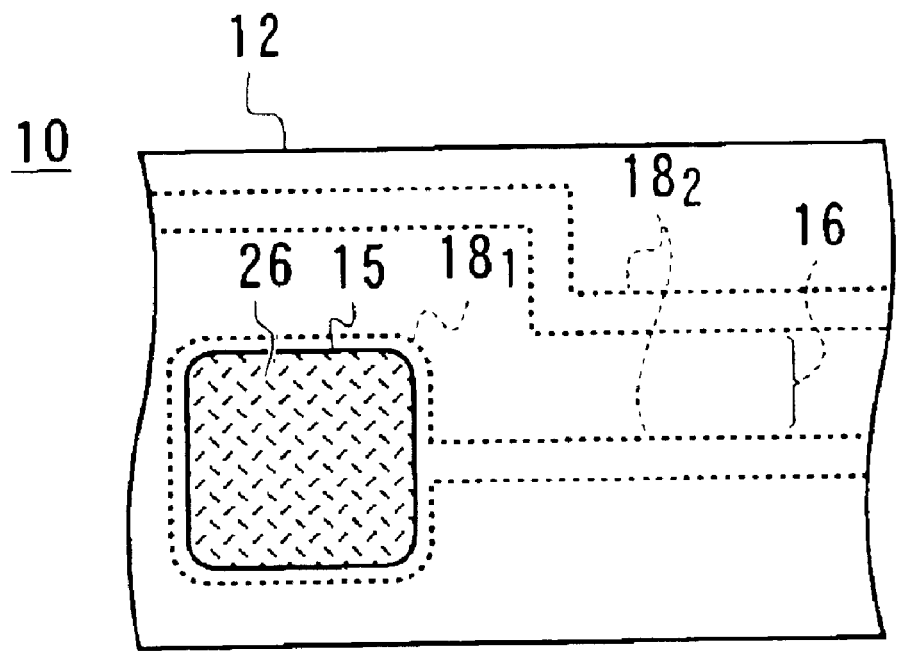
FIGS. 3(a), (b) shows plan views of the flexible wiring board piece shown in FIG. 1.
Figure 3B:
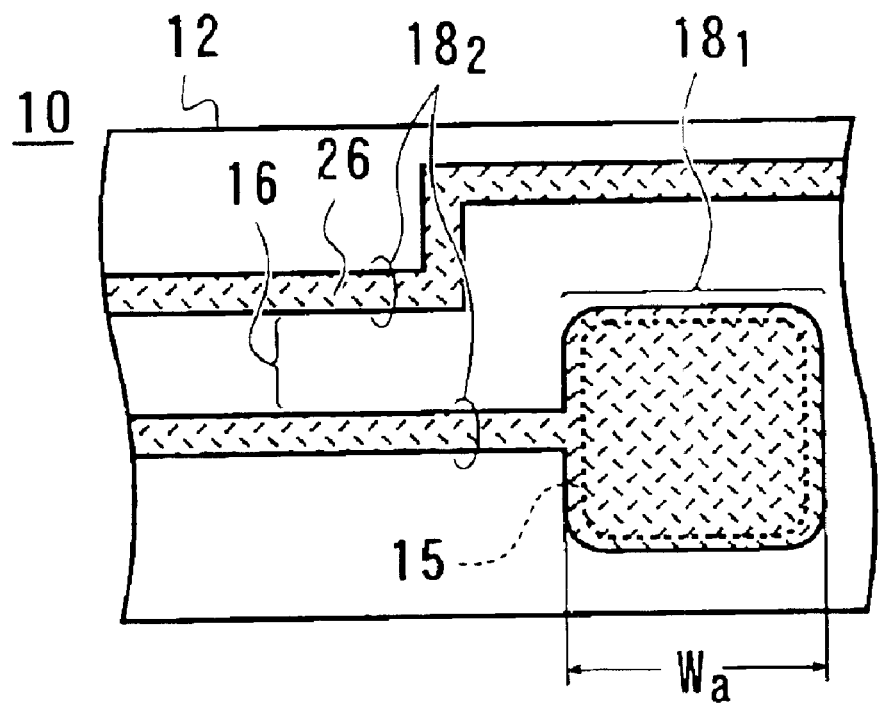

FIG. 3(a) shows a plan view of this flexible wiring board piece 10 on the side of base film 12. FIG. 3(b) shows a plan view on the side of metal wiring body 18.

As shown in FIGS. 3(a), (b), this metal wiring body 18 has a wide patterned contact region $18_1$ and a narrow interconnecting line $18_2$.

Contact region $18_1$ is used for connection to another flexible wiring board piece as described below. Interconnecting lines $18_2$ are distributed on base film 12 to electrically connect contact regions $18_1$.

When flexible wiring board piece 10 is viewed from the side of base film 12, opening 15 in base film 12 is located on contact region $18_1$ and opening 15 is smaller than contact region $18_1$ (FIG. 3(b)).

Thus, the outer periphery of contact region $18_1$ is in close contact with base film 12 to obstruct opening 15 going through base film 12. Contact region 18₁ is provided on base film 12, whereby the surface of contact region 18₁ is raised on the surface of base film 12.

Next, a process for manufacturing the other flexible wiring board piece to be combined with said flexible wiring board piece 10 is explained below.

FIG. 2(a) shows a wiring board piece in the state shown in FIG. 1(f), i.e. metal wiring body 18 has been formed and then protective film 17 has been removed.

Starting from the state shown in FIG. 2(a), a polyimide precursor solution is coated on the top of metal wiring body 18 and dried to form a polyimide precursor layer 32 (the polyimide precursor solution here is a polyimide adhesive G101 made by Sony Chemicals Corp.).

Then, polyimide precursor layer 32 is patterned by photolithography and etching and then imidated by heat treatment. The reference 33 in FIG. 2(c) represents a resin film formed by imidation of polyimide precursor layer 32 and having an opening 34 formed by patterning. This resin film 33 is thermoplastic, i.e. it develops adhesiveness upon heating. Resin film 33 here has a thickness of 14 $\mu$m.

In this state, the top surface and bottom surface of metal wiring body 18 are exposed at the bottom of opening 34 of resin film 33 and at the bottom of opening 15 of base film 12. When the assembly is electroplated as such, a metal coating 26 is formed at the exposed part of metal wiring body 18 to form a metal wiring 19. The reference 30 in FIG. 3(d) represents a flexible wiring board piece having metal coating 26 consisting of a gold coating here as described above.

Figure 4A:
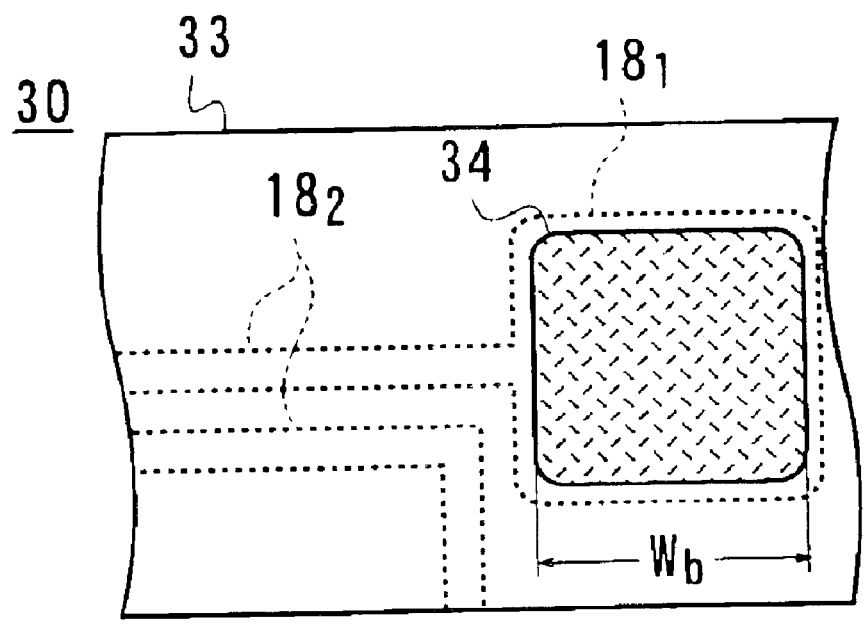
FIGS. 4(a), (b) shows plan views of the flexible wiring board piece shown in FIG. 2.
Figure 4B:
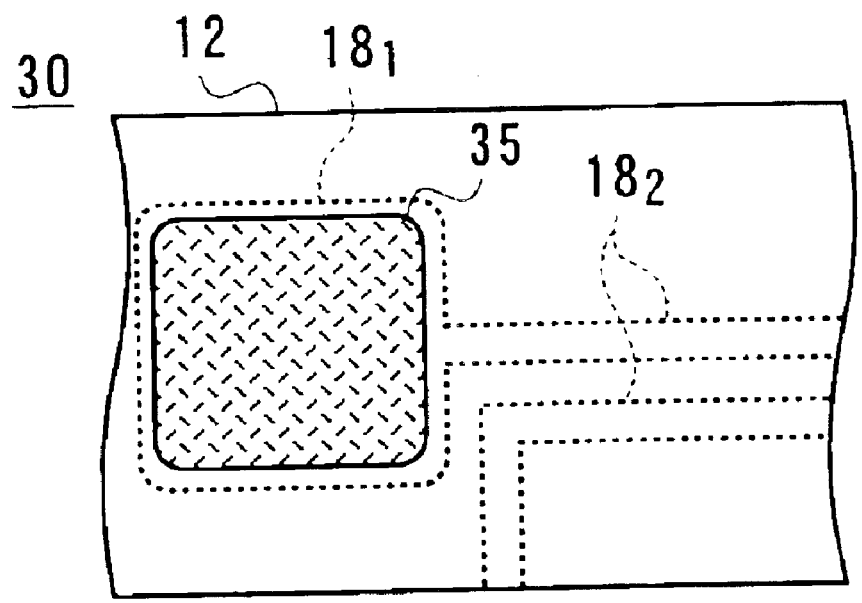

FIG. 4(a) shows a plan view of this flexible wiring board piece 30 on the side of resin film 33. FIG. 4(b) shows a plan view on the side of base film 12.

Also in this flexible wiring board piece 30, metal wiring body 18 consists of a wide contact region 18₁ and a narrow interconnecting line 18₂.

Metal coating 26 is formed and exposed at the part of contact region 18₁ located at the bottoms of openings 34, 15.

However, metal coating 26 is not formed on the surface of interconnecting line 18₂ contrary to flexible wiring board piece 10 shown in FIG. 1(e) because of electroplating in the presence of resin film 33.

Contact region 18₁ of this flexible wiring board piece 30 is larger than openings 34, 15 in resin film 33 and base film 12 so that the periphery of contact region 18₁ is inserted between resin film 33 and base film 12 to separate openings 34, 15.

A process for laminating two flexible wiring board pieces 10, 30 as described above is explained below.

Figure 5A:
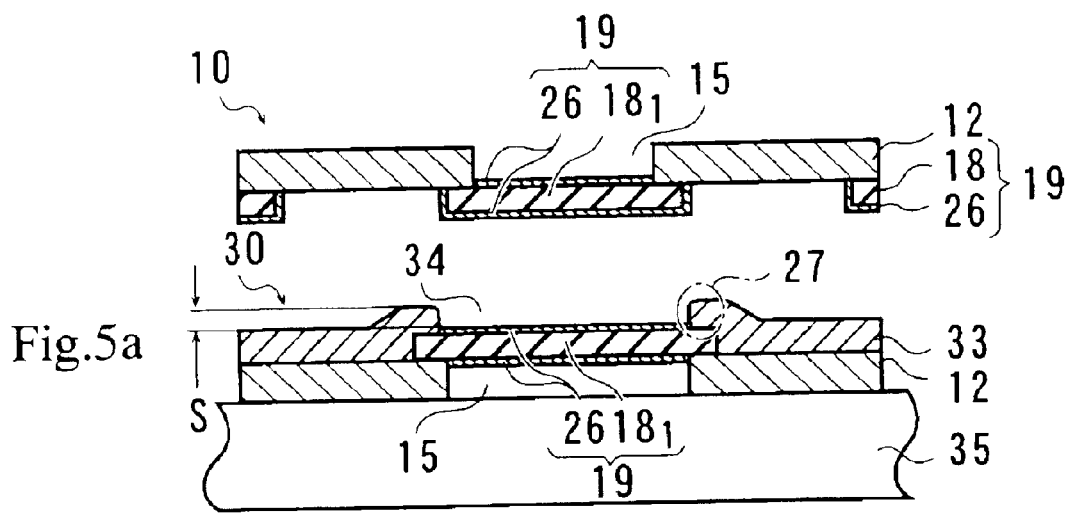
FIGS. 5(a)–(d) shows a process for manufacturing a multilayer flexible wiring board of the present invention by combining said flexible wiring board pieces.

Referring to FIG. 5(a), one flexible wiring board piece 30 of said two flexible wiring board pieces 10, 30 is mounted on a table 35 and opposed to the other flexible wiring board piece 10 in such a manner that opening 34 in resin film 33 of flexible wiring board piece 30 on table 35 faces upward opposite to contact region 18₁ of metal wiring body 18 provided on base film 12 of flexible wiring board piece 10.

Opening 34 in resin film 33 of flexible wiring board piece 30 on table 35 forms a concave with contact region 18₁ and metal coating 26 provided at the bottom of said opening, while contact region 18₁ of opposite flexible wiring board piece 10 forms a convex on base film 12.

Opening 34 forming a concave here is smaller than contact region 18₁ at the bottom of said opening 34 to leave resin film 33 at the periphery of contact region 18₁. The reference 27 in FIG. 5(a) represents the part of resin film 33 overlying contact region 18₁.

Then, two flexible wiring board pieces 10, 30 are superposed so that the part 27 overlying contact region 18₁ of resin film 33 serves to guide convex contact region 18₁ into opening 34 forming a concave.

Figure 5B:
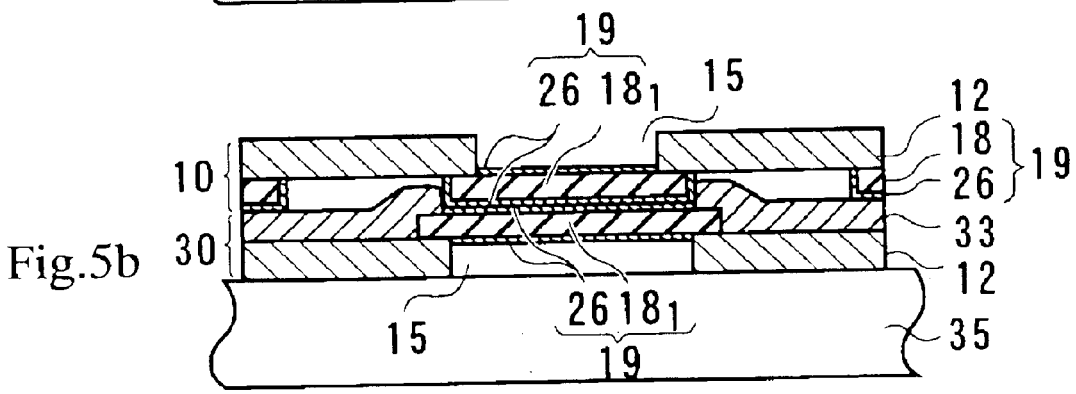

The height S of resin film 33 above contact region 18₁ (the height from metal coating 26 at the top of contact region 18₁) is smaller than the thickness of metal wiring 19 at convex contact region 18₁ (the sum of the thicknesses of metal wiring body 18 and metal coating 26) so that metal coatings 26 on the surfaces of contact regions 18₁ come into close contact when two flexible wiring board pieces 10, 30 are superposed (FIG. 5(b)).

An ultrasonic resonator 45 of an ultrasonic generator (model 7700A made by Kan Electronics Co., Ltd.) is provided above contact regions 18₁ in close contact with each other and the tip of ultrasonic resonator 45 is brought into contact with the opposite side of contact region 18₁.

Figure 5C:
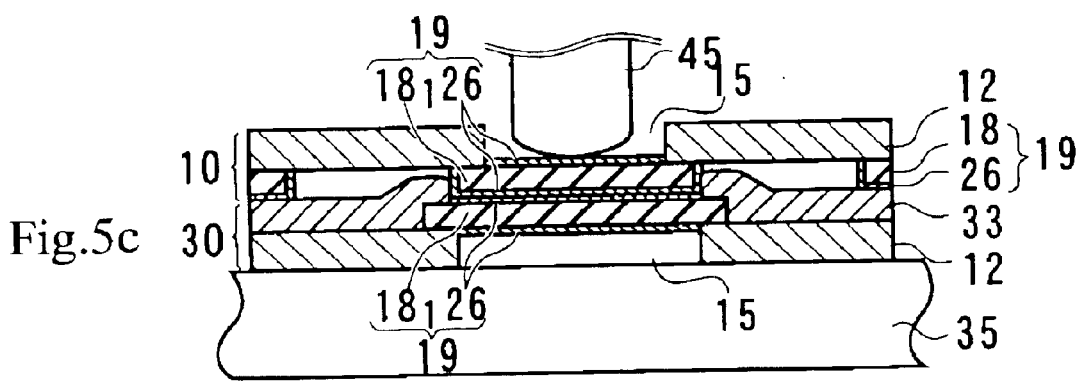

The tip of this ultrasonic resonator 45 is formed in a 100 $\mu$m×100 $\mu$m square, which is smaller than opening 15 in base film 12. Thus, ultrasonic resonator 45 is pressed against metal coating 26 on the surface of contact region 18₁ without coming into contact with base film 12 (FIG. 5(c)).

When the ultrasonic wave generator is activated to apply ultrasonic wave under pressure on contact region 18₁ by ultrasonic resonator 45, metal coatings 26 on two contact regions 18₁ are bonded together to electrically connect two flexible wiring board pieces 10, 30.

Figure 5D:
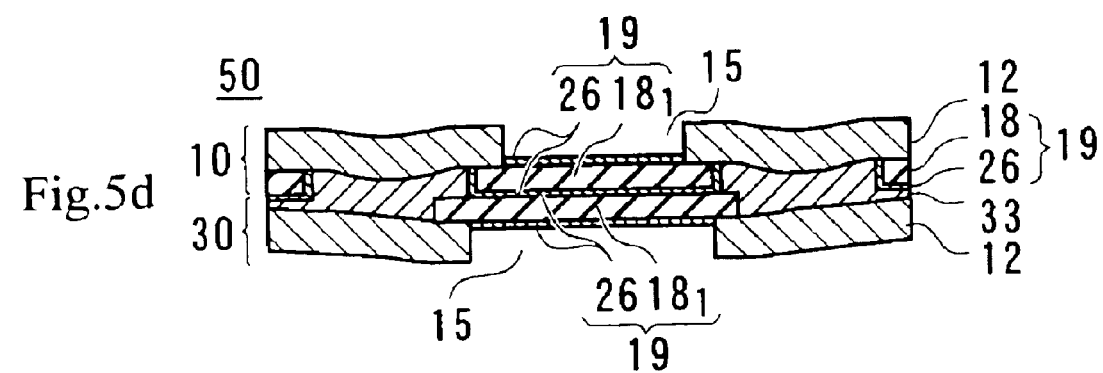

Then, flexible wiring board pieces 10, 30 are heated under pressure (at 300° C. for 10 seconds, for example) to mechanically connect flexible wiring board pieces 10, 30 via resin film 33 having developed adhesiveness, whereby a multilayer flexible wiring board 50 according to one embodiment of the present invention is obtained (FIG. 5(d)).

Although only one flexible wiring board piece 30 of two flexible wiring board pieces 10, 30 has thermoplastic resin film 33 in the foregoing embodiment, multilayer flexible wiring board 50 of the present invention is not limited to the case where such two flexible wiring board pieces 10, 30 are laminated.

Figure 6A:
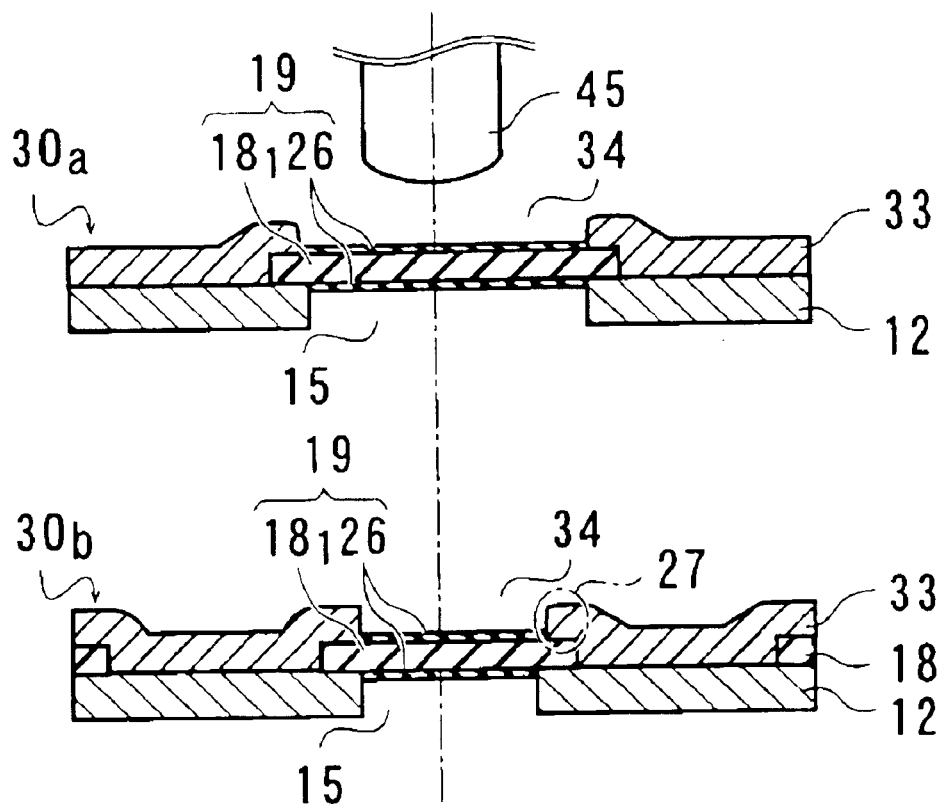
FIGS. 6(a), (b) shows another example of combination of flexible wiring board pieces for manufacturing a multilayer flexible wiring board of the present invention.
Figure 6B:
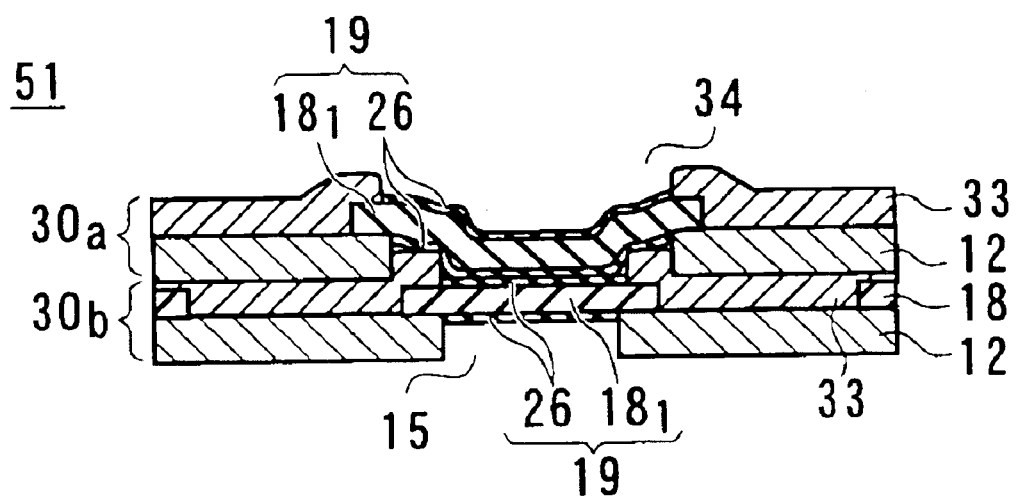

For example, flexible wiring board pieces 30 each having thermoplastic resin film 33 may be bonded to form a multilayer flexible wiring board. In this case as shown in FIG. 6(a), two flexible wiring board pieces $30_a$, $30_b$ are superposed in such a manner that base film 12 of one flexible wiring board piece $30_a$ comes into close contact with resin film 33 of the other flexible wiring board piece $30_b$, and said ultrasonic resonator 45 is pressed against contact regions 18₁ in contact with each other to apply ultrasonic wave under pressure, whereby a multilayer flexible wiring board 51 as shown in FIG. 6(b) is obtained.

In this case, opening 15 of one flexible wiring board piece $30_a$ serves as a concave, while contact region 18₁ of the other flexible wiring board piece $30_b$ serves as a convex member. Contact region 18₁ serving as a convex member is smaller than opening 15 serving as a concave so that base film 12 at the periphery of opening 15 serves to readily guide convex contact region 18₁ into opening 15 to facilitate aligning between flexible wiring board pieces $30_a$, $30_b$.

Alternatively, a thermoplastic resin film may be provided on flexible wiring board piece 10 shown in FIG. 1(g) to prepare a multilayer flexible wiring board.

Figure 7A:
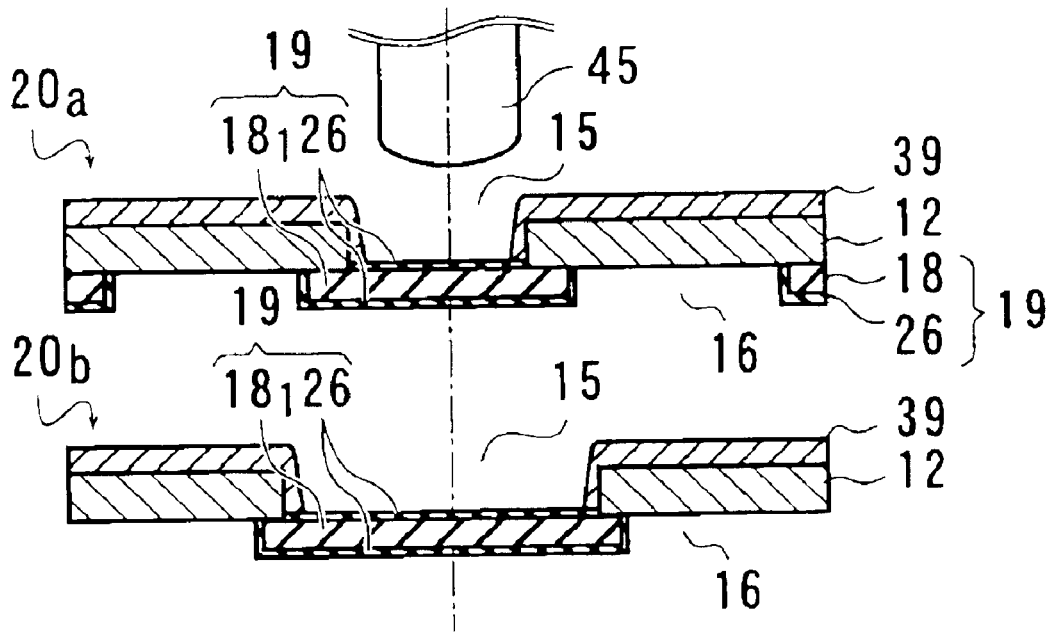
FIGS. 7(a), (b) shows still another example of combination of flexible wiring board pieces for manufacturing a multilayer flexible wiring board of the present invention.

The references $20_a$, $20_b$ in FIG. 7 represent such flexible wiring board pieces, in which a thermoplastic resin film 39 is formed on base film 12 of flexible wiring board piece 10 shown in FIG. 1(g). Resin film 39 is patterned and opening 15 in base film 12 is etched to expose metal coating 26 at the bottom of opening 15.

In these flexible boards $20_a$, $20_b$, contact region $18_1$ of one flexible wiring board piece $20_a$ is smaller than opening 15 of the other flexible wiring board piece $20_b$. Therefore, convex contact region $18_1$ of one flexible wiring board piece $20_a$ is forced into a concave formed by opening 15 of the other flexible wiring board piece $20_b$ to connect contact regions $18_1$.

Figure 7B:
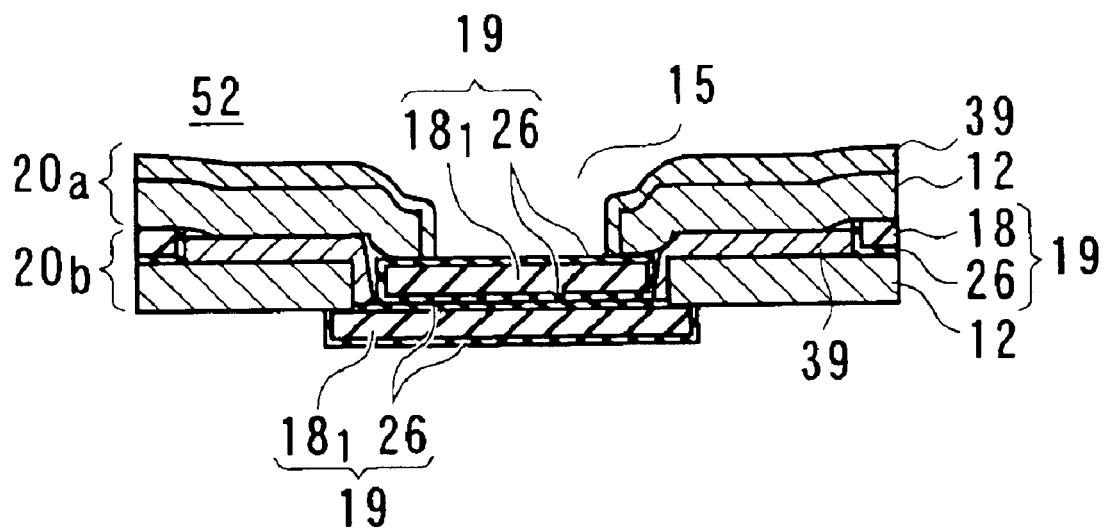
Figure 8:
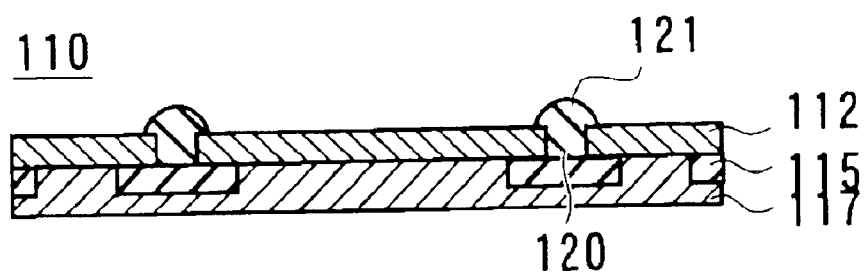
FIG. 8 shows a flexible wiring board piece of one of example.
Figure 9:
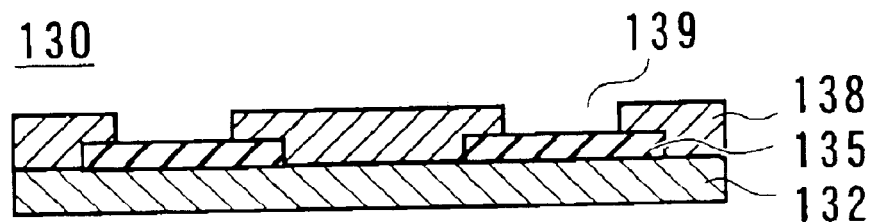
FIG. 9 shows a flexible wiring board piece of one of example used with the flexible wiring board piece shown in FIG. 8.
Figure 10A:
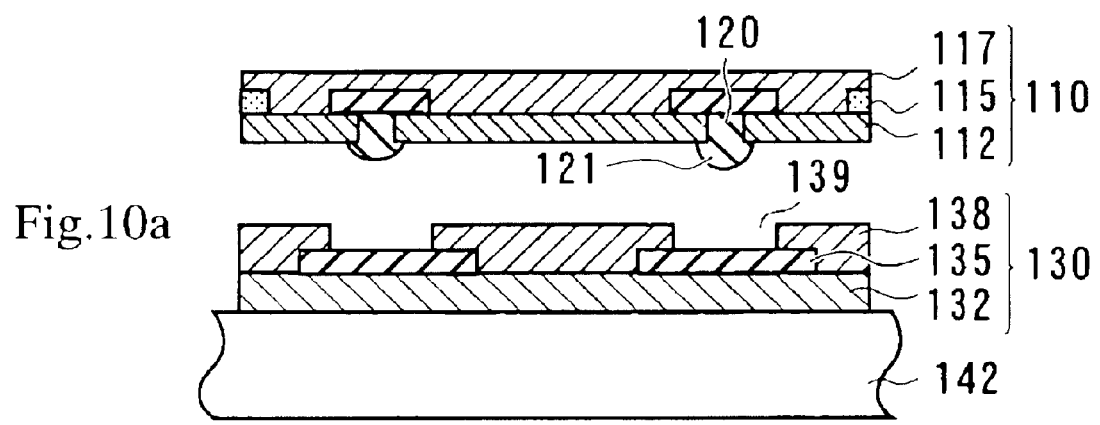
FIGS. 10(a)–(c) shows one of the example of a process for manufacturing a multilayer flexible wiring board.
Figure 10B:
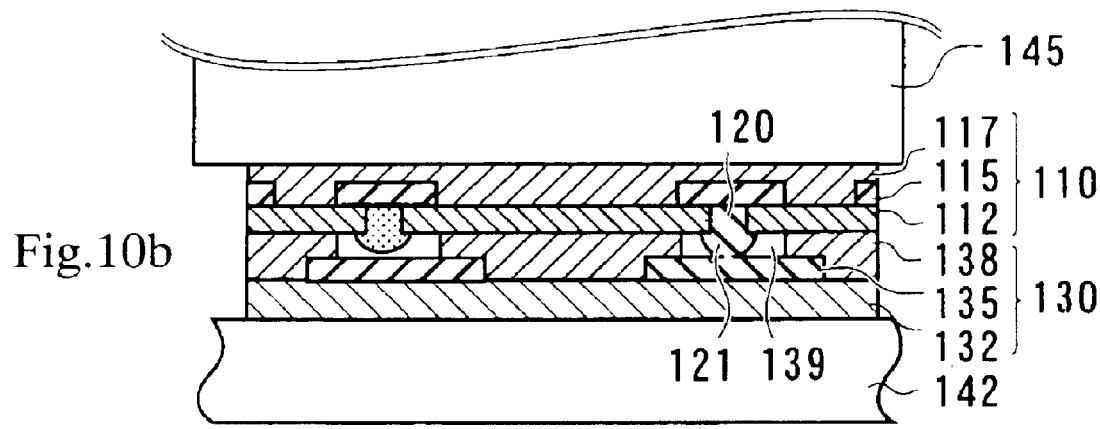
Figure 10C:
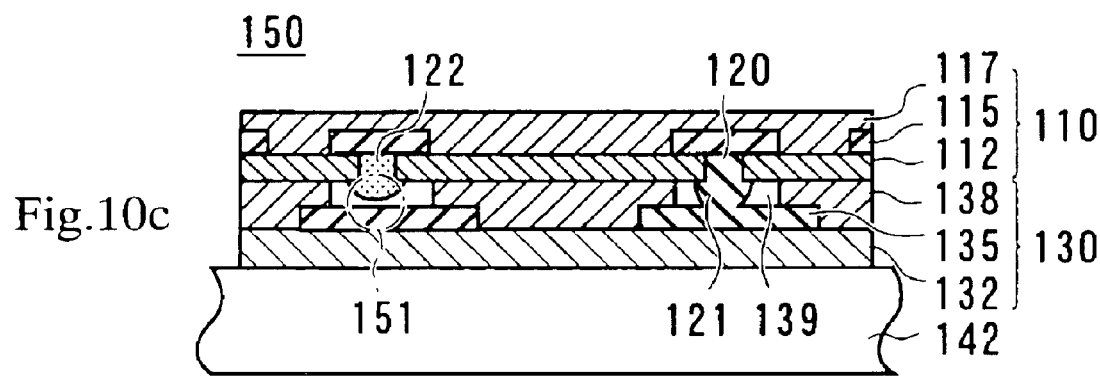

When ultrasonic resonator 45 is pressed against the top of contact regions $18_1$ as such to apply ultrasonic wave to heat flexible wiring board pieces $20_a$, $20_b$ under pressure on contact regions $18_1$, metal coatings 26 on the surfaces of contact regions $18_1$ are bonded together by ultrasonic vibration, and base films 12 are connected via resin film 39, whereby a multilayer flexible wiring board 52 as shown in FIG. 7(b) is obtained.

Although two flexible wiring board pieces were connected in the foregoing examples, a multilayer flexible wiring board prepared by laminating three or more flexible wiring board pieces is also included in the present invention.

Although a polyimide adhesive was used for thermoplastic resin films 33, 39 in the foregoing examples, the present invention is not limited to this material but also includes the use of resins other than polyimide adhesives such as epoxy adhesives (such as A100 made by Sony Chemicals Corp.).

Metal coating 26 is not limited to a coating based on gold, but may also be a coating based on silver, a coating based on nickel, a copper-nickel alloy coating or a solder coating. Good connection is obtained when the same type metal coating is formed on two flexible wiring board pieces to be laminated.

For bonding, ultrasonic wave may be applied with an ultrasonic resonator directly pressed against the metal wiring body at the contact region or the metal coating formed on the surface thereof. If a plurality of contact regions is to be ultrasonically bonded, an ultrasonic resonator may be individually pressed against the contact regions to apply ultrasonic wave under pressure.

Although a process for applying ultrasonic wave to metal wirings by contacting the tip of an ultrasonic resonator and then applying ultrasonic wave is described above, the present invention is not limited to this process, but also a process for contacting the tip of ultrasonic resonator with metal wirings while applying ultrasonic wave to the tip of ultrasonic resonator.

According to the present invention bumpless ultrasonic bonding is simplify the process.

Contact regions have a uniformity of height to reduce connection failure.

What is claimed is:

1. A process for manufacturing multilayer flexible wiring board by bonding metal wiring of at least two flexible wiring board pieces having a base film including a resin film and a metal wiring provided on said base film, comprising the steps of:
   a) placing said metal wirings of said two flexible wiring board pieces in close contact with each other at their surfaces,
   b) contacting the tip of an ultrasonic resonator with an exposed opposite side of a bonding portion of said metal wiring of at least one flexible wiring board piece of two flexible wiring board pieces to be bonded; and
   c) applying an ultrasonic wave to said ultrasonic resonator to bond said two metal wirings to be bonded.

2. The process according to claim 1, further comprising the steps of:
   providing a thermoplastic resin layer on said at least one flexible wiring board piece to be exposed to the bonding portion of said metal wiring before performing step a), and
   adhering said two flexible wiring board pieces using said thermoplastic resin layer after performing step c),
   wherein said two metal wirings are electrically bonded by the step c).

3. The process according to claim 2, wherein said metal wirings are ultrasonically bonded and then heated to laminate said flexible wiring pieces by the adhesion of said thermoplastic.

4. The process according to claim 1, wherein ultrasonic wave is individually applied to the parts of said metal wirings to be bonded.

5. The process according to claim 1, wherein a metal coating is preliminarily formed on at least one of the surfaces of the parts of said metal wirings to be ultrasonically bonded before said metal wirings are ultrasonically bonded, the metal coating including at least one of gold, silver, nickel, copper-nickel alloy, aluminum, titanium and solder.

6. A process for manufacturing a multilayer flexible wiring board according to claim 1 further comprising the steps of:
   projecting said bonding portion of one flexible wiring board piece in said two flexible wiring board pieces at the top of a convex and exposing said boding portion of the other flexible wiring board piece at the bottom of a concave before performing step a), and
   with said bonding portions being in close contact with each other, putting said bonding portion of the convex into said bonding portion of the concave at step b).

7. A multilayer flexible wiring board that is formed by laminating at least two flexible wiring board pieces having a base film and a metal wiring provided on said base film, wherein at least one flexible wiring board piece has a cover film including a resin film on said metal wiring and a first opening is provided on said cover film, and said metal wiring exists at the bottom of said first opening so that said metal wirings of said flexible wiring board pieces are electrically bonded to each other by applying ultrasonic wave while the part of said metal wiring located at the bottom of said first opening is in close contact with said metal wiring of the other flexible wiring board piece, and further wherein said first opening and said metal wiring located at the bottom of said first opening form a concave, and the part said metal wiring of the other flexible wiring board piece to be bonded to said concave forms a convex on said base film.

8. The multilayer flexible wiring board according to claim 7 wherein said convex part of said metal wiring of the other flexible wiring board piece has an area smaller than the area of said first opening forming said concave.

9. The multilayer flexible wiring board according to claim 7, wherein at least one of the surfaces of the part said metal wiring to be ultrasonically bonded has a metal coating, the metal coating including at least one of gold, silver, nickel, copper-nickel alloy, aluminum, titanium and solder.

10. The multilayer flexible wiring board according to claim 9, wherein said metal wiring to be bonded to each other have the same type metal coating on their surfaces.

11. The multilayer flexible wiring board according to claim 7, wherein said cover film has insulating properties to prevent said connected metal wiring from contacting with each other except for the part located at said first opening.

12. The multilayer flexible wiring board according to claim 11, wherein said cover film has a thermoplastic resin layer developing adhesiveness upon heating at least on its surface.

13. A multilayer flexible wiring board formed by laminating at least two flexible wiring board pieces having a base film and a metal wiring provided on said base film, wherein said base film of at least one flexible wiring board piece has an opening in which said metal wiring exists at the bottom so that said metal wirings are electrically bonded to each other by applying ultrasonic wave while said metal wiring of the other flexible wiring board piece is in close contact with said metal wiring located at the bottom of said opening, said opening and said metal wiring located at the bottom of the opening form a concave, and the part of the metal wiring of the other wiring board piece to be bonded to said concave forms a convex.

14. The multilayer flexible wiring board according to claim 13 wherein said base film has insulating properties to prevent said connected metal wirings from contacting with each other except for the part located at said second opening.

* * * * *